（12）United States Patent
Park

(10) Patent No.: US 12,399,424 B2
(45) Date of Patent: Aug. 26, 2025

(54) PHOTOMASK ASSEMBLY

(71) Applicant: Samsung Display Co., LTD., Yongin-si (KR)

(72) Inventor: Hyung-Gyu Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 65 days.

(21) Appl. No.: 17/382,220

(22) Filed: Jul. 21, 2021

(65) Prior Publication Data

US 2022/0179303 A1 Jun. 9, 2022

(30) Foreign Application Priority Data

Dec. 9, 2020 (KR) .................. 10-2020-0171344

(51) Int. Cl.
*G03F 1/60* (2012.01)
*G02B 3/00* (2006.01)
*G03F 1/64* (2012.01)

(52) U.S. Cl.
CPC .................. *G03F 1/60* (2013.01); *G03F 1/64* (2013.01); *G02B 3/0037* (2013.01)

(58) Field of Classification Search
CPC ............ G03F 1/60; G03F 1/64; G02B 3/0037
See application file for complete search history.

(56) References Cited

U.S. PATENT DOCUMENTS

| 9,036,271 B2 | 5/2015 | Hung et al. |
| 2004/0223071 A1* | 11/2004 | Wells ................ H01L 27/14627 348/340 |
| 2008/0102641 A1* | 5/2008 | Ono .......................... G03F 1/50 438/720 |
| 2012/0320466 A1* | 12/2012 | Hung ............... B29D 11/00365 216/26 |
| 2015/0309385 A1* | 10/2015 | Shu ...................... G02B 3/0037 359/296 |
| 2017/0003585 A1* | 1/2017 | Lin ........................... G03F 1/62 |
| 2019/0258153 A1* | 8/2019 | Nemani ............... B05D 3/0209 |
| 2020/0083484 A1* | 3/2020 | Lee .................... H10K 50/8445 |
| 2020/0393765 A1 | 12/2020 | Sakanishi |

FOREIGN PATENT DOCUMENTS

| KR | 10-0219485 | 9/1999 |
| KR | 10-2012-0095570 A | 8/2012 |
| KR | 10-2014-0008038 A | 1/2014 |
| KR | 10-2014-0142532 A | 12/2014 |
| KR | 10-2017-0021190 A | 2/2017 |
| KR | 10-2020-0028257 A | 3/2020 |
| KR | 10-2020-0124252 A | 11/2020 |

* cited by examiner

*Primary Examiner* — Jonathan Johnson
*Assistant Examiner* — Jayson D Cosgrove
(74) *Attorney, Agent, or Firm* — Womble Bond Dickinson (US) LLP

(57) ABSTRACT

A photomask assembly includes: a transparent substrate; a first insulating layer on the transparent substrate and having hydrophilicity; a first metal layer on the first insulating layer and having a first opening; a second insulating layer on the first metal layer and having hydrophobicity; and a lens unit in the first opening.

19 Claims, 23 Drawing Sheets

PHOTOMASK ASSEMBLY

CROSS-REFERENCE TO RELATED APPLICATION

This application claims priority to and the benefit of Korean Patent Application No. 10-2020-0171344, filed in the Korean Intellectual Property Office on Dec. 9, 2020, the entire content of which is hereby incorporated by reference.

BACKGROUND

1. Field

The present disclosure relates to a photomask assembly.

2. Description of the Related Art

In a manufacturing process of a display device, a lithography process is utilized (e.g., used) to form signal wires. In the lithography process, a photomask assembly is utilized (e.g., used) to transfer a desired pattern onto a substrate. As a line width of the signal wire decreases, importance of the photomask assembly utilized (e.g., used) in the lithography process to implement this (e.g., to form signal wires) increases.

The above information disclosed in this Background section is only for enhancement of understanding of the background of the present disclosure, and therefore it may contain information that does not form the prior art.

SUMMARY

Aspects of embodiments of the present disclosure are directed towards a photomask assembly capable of forming a signal wire having a fine line width.

A photomask assembly according to an embodiment includes: a transparent substrate; a first insulating layer on the transparent substrate and having hydrophilicity; a first metal layer on the first insulating layer and having a first opening; a second insulating layer on the first metal layer and having hydrophobicity; and a lens unit in the first opening.

The photomask assembly may include a pellicle overlapping the transparent substrate, and the lens unit may have a surface protruded toward the pellicle.

The lens unit may include a plurality of sub-lens units in the first opening.

The photomask assembly may further include a polymer layer covering the plurality of sub-lens unit.

The plurality of sub-lens units may each be different in refractive index than the polymer layer (e.g., the plurality of sub-lens units and the polymer layer may have different refractive indices from each other).

A photomask assembly according to an embodiment includes: a transparent substrate; a first insulating layer on the transparent substrate; a first metal layer on the first insulating layer and having a first opening; a second insulating layer on the first metal layer and having a second opening; and a lens unit in the first opening and the second opening, wherein the lens unit includes at least two or more sub-lens units.

The photomask assembly may further include a polymer layer covering the two or more sub-lens units.

The polymer layer may overlap the first opening and the second opening.

The first insulating layer may have hydrophilicity.

The first metal layer may include (e.g., be) chromium (Cr) and/or molybdenum (Mo).

The second insulating layer may have hydrophobicity.

The two or more sub-lens units may include (e.g., be) a first polymer having hydrophilicity.

The first polymer may include (e.g., be) a polyester-based compound.

The polymer layer may include (e.g., be) a second polymer, and the polymer layer may be different in refractive index than each of the two or more sub-lens units (e.g., the polymer layer and the two or more sub-lens units may have different refractive indices from each other).

The photomask assembly may further include a pellicle overlapping the transparent substrate.

A photomask assembly according to an embodiment includes: a transparent substrate; a first insulating layer on the transparent substrate; a first metal layer on the first insulating layer and having a first opening; a second insulating layer on the first metal layer and having a second opening; a lens unit in the first opening and the second opening; and a polymer layer covering the lens unit, wherein the lens unit is different in refractive index than the polymer layer.

Each of the lens unit and the polymer layer may include (e.g., be) a polyester-based compound.

The first insulating layer may have hydrophilicity and the second insulating layer may have hydrophobicity.

The first insulating layer may include (e.g., be) a silicon oxide, and the second insulating layer may include (e.g., be) a silicon nitride.

The first metal layer may include (e.g., be) chromium (Cr) and/or molybdenum (Mo).

According to an embodiment, a photomask assembly may be capable of easily manufacturing a display device having a fine line width.

BRIEF DESCRIPTION OF THE DRAWINGS

The accompanying drawings, which are incorporated in and constitute a part of this specification, illustrate embodiments of the present disclosure. The drawings, together with the description, serve to better explain aspects and principles of the present disclosure.

DETAILED DESCRIPTION

Figure 1:
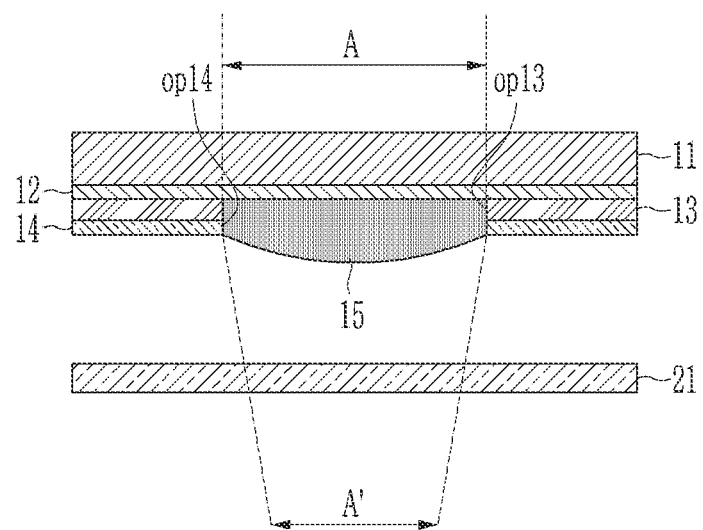
FIG. 1 is a cross-sectional view of a photomask assembly according to an embodiment.

The present disclosure will be described more fully hereinafter with reference to the accompanying drawings, in which embodiments of the present disclosure are shown. As those skilled in the art would realize, the described embodiments may be modified in various suitable and different ways, without departing from the spirit or scope of the present disclosure.

In order to clearly explain the present disclosure, portions that are not directly related to the present disclosure may be omitted, and the same reference numerals are used for the same or similar constituent elements through the entire specification.

In addition, the size and thickness of each configuration shown in the drawings may be exaggerated or arbitrarily shown for better understanding and for ease of description, and the present disclosure is not limited thereto. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or one or more intervening element(s) may also be present. In contrast, when an element is referred to as being "directly on" another element, there are no intervening elements present. Further, the word "on," "above," and similar terms may refer to a position on or below an object and does not necessarily refer to a position on an upper side of the object based on a gravitational direction.

In addition, unless explicitly described to the contrary, the word "comprise," and variations such as "comprises" or "comprising," will be understood to imply the inclusion of stated elements but not the exclusion of any other elements.

Further, in the specification, the phrase "in a plan view" may refer to a view from above and/or below an object, and the phrase "in a cross-sectional view" may refer to a side view of a cross-section taken by vertically cutting an object.

As used herein, the use of the term "may," when describing embodiments of the present disclosure, refers to "one or more embodiments of the present disclosure." As used herein, the term "and/or" includes any and all combinations of one or more of the associated listed items. As used herein, the terms "substantially," "about," "approximately," and similar terms are used as terms of approximation and not as terms of degree, and are intended to account for the inherent deviations in measured or calculated values that would be recognized by those of ordinary skill in the art.

Hereinafter, a photomask assembly according to an embodiment is described with reference to FIG. 1. FIG. 1 is a cross-sectional view of a photomask assembly according to an embodiment.

A photomask assembly according to an embodiment may include a transparent substrate 11, a first insulating layer 12, a first metal layer 13, a second insulating layer 14, and a lens unit 15.

The transparent substrate 11 may transmit all incident light. The transparent substrate 11 may include (e.g., be) a glass substrate made of quartz.

The first insulating layer 12 may be positioned on (e.g., may cover) the surface (e.g., the entire surface) of the transparent substrate 11. The first insulating layer 12 may have hydrophilicity. The first insulating layer 12 may include (e.g., be) any material having hydrophilicity, but the present disclosure is not limited thereto. In some embodiments, the first insulating layer 12 may include (e.g., be) a silicon oxide (e.g., silicon dioxide) as an example.

The first metal layer 13 may be a light blocking pattern that blocks irradiated light. For example, the first metal layer 13 may absorb and/or reflect incident light irradiated onto the first metal layer 13. The first metal layer 13 may include (e.g., be) chromium (Cr) and/or molybdenum (Mo). For example, the first metal layer 13 may include (e.g., be) chromium (Cr) or a chromium compound. As an example, the chromium compound may include (e.g., be) one or more selected from among chromium nitride (CrN), chromium oxide (CrO), chromium carbide (CrC), chromium carbonate (CrCO), chromium carbonitride (CrCN), chromium oxynitride (CrON), chromium carbide oxynitride (CrCON), chromium fluoride (CrF), chromium fluoride nitride (CrNF), chromium oxyfluoride (CrOF), chromium carbide fluoride (CrCF), chromium carbide fluoride nitride (CrCNF), chromium fluoride oxynitride CrONF), and chromium carbide oxynitride fluoride (CrCONF).

The first metal layer 13 may have substantially the same pattern as the transferred pattern. The first metal layer 13 has the first opening op13 in which a pattern is removed.

The second insulating layer 14 may be positioned on the first metal layer 13. The second insulating layer 14 may have hydrophobicity. The second insulating layer 14 may include (e.g., be) any material having hydrophobicity, but the present disclosure is not limited thereto. In some embodiments, the second insulating layer 14 may include (e.g., be) silicon nitride as an example.

The second insulating layer 14 may have substantially the same plane shape (e.g., same shape in a plan view) as the first metal layer 13. The second insulating layer 14 may have substantially the same pattern as the transferred pattern. The edges of the second insulating layer 14 and the first metal layer 13 may be aligned with each other. The second insulating layer 14 may have a second opening op14 aligned with the first opening op13. For example, the second opening op14 may overlap the first opening op13 in a plan view. In some embodiments, side walls of the second insulating layer 14 forming the second opening op14 may be aligned with side walls of the first metal layer 13 forming the first opening op13.

A lens unit 15 may be positioned within the first opening op13 and the second opening op14. The lens unit 15 may focus or diffuse irradiated light (e.g., incident light). The lens unit 15 may have a convex lens shape. For example, a surface of the lens unit 15 (e.g., a surface of the lens unit 15 facing away from the transparent substrate 11) may protrude away from the transparent substrate 11 and/or towards a pellicle layer 21. The lens shape (the shape of the lens unit 15) is not limited thereto, and the lens shape may be any suitable lens shape that is generally available or obvious to a person of ordinary skill in the art such as a concave lens shape or an aspherical lens shape.

The lens unit 15 may be manufactured utilizing (e.g., using), for example, an Inkjet process and/or a screen printing process.

Since the lens unit 15 has a convex lens shape, light passing through the lens unit 15 may be concentrated to a predetermined region. Accordingly, the light exposure region A' of the photoresist layer to which the light transmitted through the lens unit 15 arrives may be smaller than the light exposure region A of the photoresist layer to which the light transmitted through the transparent substrate 11 arrives in the absence of the lens unit 15. For example, the light exposure region A' may refer to a region (e.g., a planar region) of a surface (e.g., a surface of a substrate on which a wire, for example a signal wire, is to be formed) that light transmitted through the photomask assembly including the lens unit 15 is incident on, and the light exposure region A may refer to a region (e.g., a planar region) of the surface that light that would be transmitted through the photomask assembly without the lens unit 15 would be incident on. Accordingly, the light exposure region A may substantially correspond to the planar region of the first and second openings op13 and op14. A size of the light exposure region A' may be adjusted by adjusting the curvature and/or curvature radius of the convex lens of the lens unit 15. This may be applied even when the lens unit 15 has a different lens shape. For example, the size of the light exposure region A' may be adjusted by adjusting the curvature of the lens unit 15 even when the lens shape of the lens unit 15 is a shape other than a convex lens shape. The lens unit 15 may easily adjust the width of the signal wire formed on the substrate, and it is possible to easily implement fine wiring and fine patterns through this.

The lens unit 15 may include (e.g., be) a material having high transmittance. For example, the lens unit 15 may include (e.g., be) a polymer-based material. The polymer-based materials appropriately select and utilize (e.g., use) acryl-based polymer, a silicon-based polymer, polyester, polyurethane, polyamide, polyvinyl ether, a vinyl acetate and/or vinyl chloride copolymer, a modified polyolefin, an epoxy-based polymer, a fluorine-based polymer, natural rubber, a rubber-based polymer such as synthetic rubber, etc., as a base polymer. In some embodiments, the lens unit 15 may include (e.g., be) one or more of the above-listed materials.

The photomask assembly 1 according to an embodiment may further include a pellicle layer 21 overlapping the transparent substrate 11. The pellicle layer 21 may protect a laminated composition on the transparent substrate 11 from external contaminant materials such as dust and/or a resist during the lithography process. The pellicle layer 21 may have high light transmittance, an excellent heat dissipation characteristic, strength, durability, and/or stability.

In some embodiments, a protective layer for protecting the pellicle layer 21, an adhesive layer for bonding the pellicle layer 21 and the transparent substrate 11, and/or the like may be further included.

Figure 2:
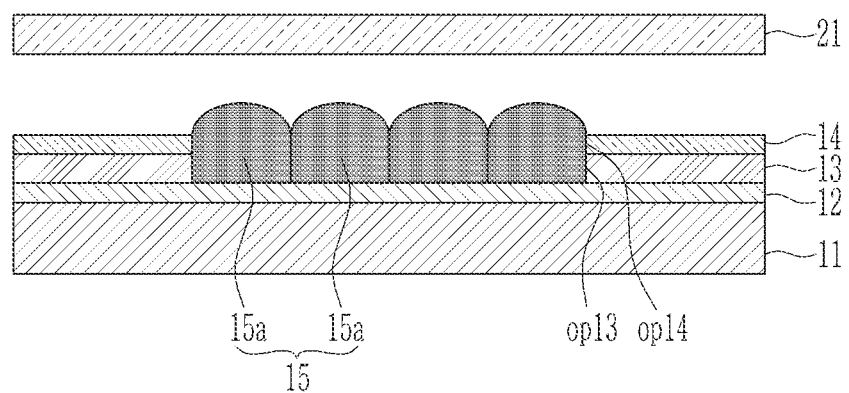
FIG. 2 and FIG. 3 are cross-sectional views of a photomask assembly according to an embodiment, respectively.
Figure 3:
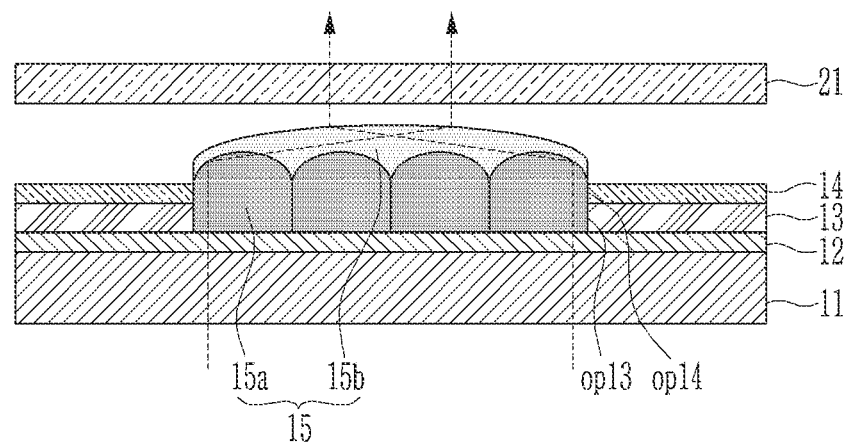

Next, the photomask assembly according to an embodiment is described with reference to FIG. 2 and FIG. 3. FIG. 2 and FIG. 3 are cross-sectional views of a photomask assembly according to an embodiment, respectively. The description of the same constituent elements as the above-described constituent elements may not be provided.

Referring to FIG. 2, the lens unit 15 according to an embodiment may include a plurality of sub-lens units 15a. At least two or more sub-lens units 15a may be disposed within the first opening op13 and the second opening op14.

Each of the sub-lens units 15a may have a convex lens shape, and thus, light passing through the sub-lens unit 15a may be concentrated to a predetermined region. The sub-lens unit 15a may control the size of the exposure region of the irradiated light by adjusting the curvature or curvature radius of the convex lens shape. The sub-lens unit 15a may easily adjust the width of the signal wire formed on the substrate, and it is possible to easily implement fine wiring and fine patterns through this.

Referring to FIG. 3, the photomask assembly according to an embodiment may further includes a polymer layer 15b covering a plurality of sub-lens units 15a. The polymer layer 15b may be disposed inside the edges of the first opening op13 and the second opening op14. In some embodiments, the polymer layer 15b may cover a side of the sub-lens units 15a facing away from the transparent substrate 11, and the polymer layer 15b may fill a gap or space between the sub-lens units 15a and sidewalls of the first metal layer 13 forming the first opening op13 and/or sidewalls of the second insulating layer 14 forming the second opening op14.

According to an embodiment, the sub-lens unit 15a may include (e.g., be) a first polymer and the polymer layer 15b may include (e.g., be) a second polymer. The first polymer and the second polymer may have refractive indices (indices of refraction) that are different from each other. The sub-lens unit 15a and the polymer layer 15b may have refractive indices that are different from each other. Accordingly, as shown in FIG. 3, the path of the irradiated light may be moved along a parallel path while being focused through a combination of two convex lenses. The diffraction of the irradiated light may thereby be reduced. When utilizing (e.g., using) the photomask assembly according to an embodiment, it may be easily adjusted to have the width of the signal wire required for the manufacturing process. In some embodiments, the first polymer may have hydrophilicity.

Next, the manufacturing method of the photomask assembly according to an embodiment is described with reference to FIG. 4A to FIG. 13B. FIG. 4A, FIG. 5A, FIG. 6A, FIG. 7A, FIG. 8A, FIG. 9A, FIG. 10A, FIG. 11A, FIG. 12A, and FIG. 13A are perspective views of a photomask assembly according to a manufacturing process, respectively, and FIG. 4B, FIG. 5B, FIG. 6B, FIG. 7B, FIG. 8B, FIG. 9B, FIG. 10B, FIG. 11B, FIG. 12B, and FIG. 13B are cross-sectional views of a photomask assembly according to a manufacturing process, respectively.

Figure 4A:
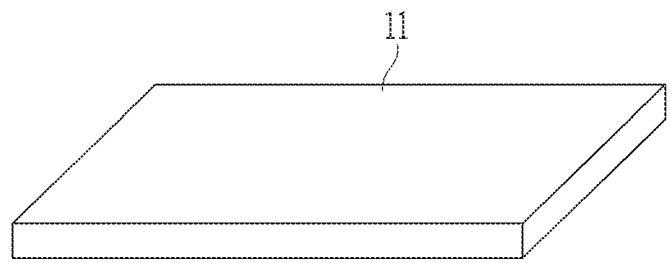
FIG. 4A, FIG. 5A, FIG. 6A, FIG. 7A, FIG. 8A, FIG. 9A, FIG. 10A, FIG. 11A, FIG. 12A, and FIG. 13A are perspective views of a photomask assembly according to a manufacturing process, respectively.
Figure 4B:
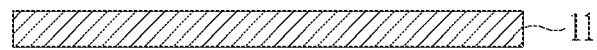
FIG. 4B, FIG. 5B, FIG. 6B, FIG. 7B, FIG. 8B, FIG. 9B, FIG. 10B, FIG. 11B, FIG. 12B, and FIG. 13B are cross-sectional views of a photomask assembly according to a manufacturing process, respectively.

First, referring to FIG. 4A and FIG. 4B, a transparent substrate 11 is prepared. The transparent substrate 11 may include (e.g., be) a glass substrate made of quartz. The transparent substrate 11 may transmit all (e.g., substantially all) incident light.

Figure 5A:
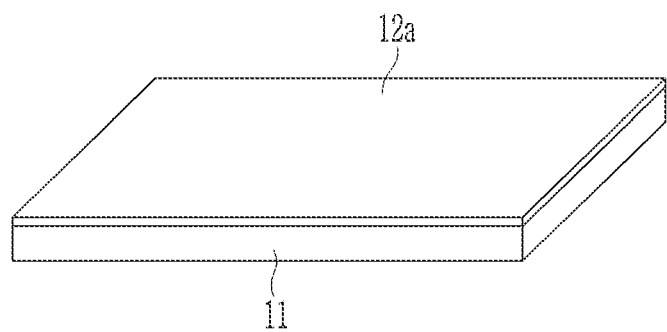
Figure 5B:
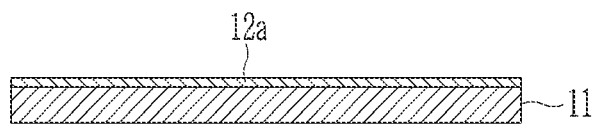

Next, referring to FIG. 5A and FIG. 5B, a first insulating material layer 12a overlapping the surface (e.g., the entire surface) of the transparent substrate 11 is formed. The first insulating material layer 12a may be formed by utilizing (e.g., using) a chemical vapor deposition method as an example. The first insulating material layer 12a may have hydrophilicity. The first insulating material layer 12a may include (e.g., be) any material having hydrophilicity. In some embodiments, the first insulating material layer 12a may include (e.g., be) a silicon oxide (e.g., silicon dioxide) as an example.

Figure 6A:
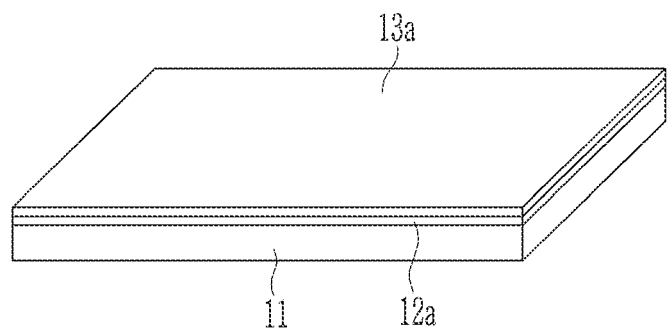
Figure 6B:
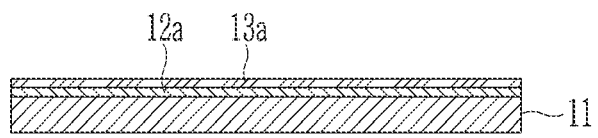

Next, as shown in FIG. 6A and FIG. 6B, a first metal material layer 13a overlapping the surface (e.g., the entire surface) of the transparent substrate 11 is formed on the first insulating material layer 12a. The first metal material layer 13a may include (e.g., be) any metal that blocks light, and for example, may include (e.g., be) chromium and/or molybdenum.

Figure 7A:
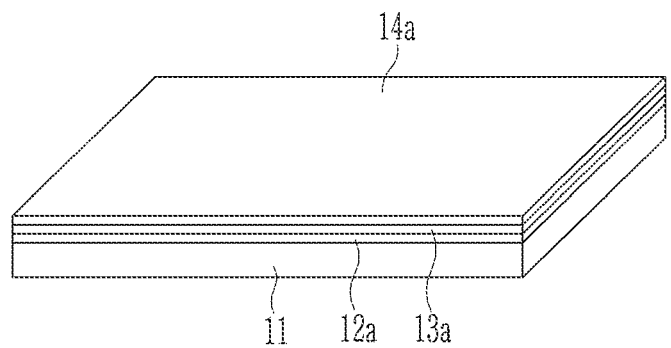
Figure 7B:
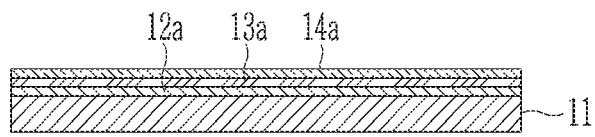

As shown in FIG. 7A and FIG. 7B, a second insulating material layer 14a is formed on the first metal material layer 13a. The second insulating material layer 14a may be formed by utilizing (e.g., using) a chemical vapor deposition method as an example. The second insulating material layer 14a may overlap the surface (e.g., the entire surface) of the transparent substrate 11. The second insulating material layer 14a may have hydrophobicity. The second insulating material layer 14a may include (e.g., be) any material having hydrophobicity. In some embodiments, the second insulating material layer 14a may include (e.g., be) a silicon nitride as an example.

Figure 8A:
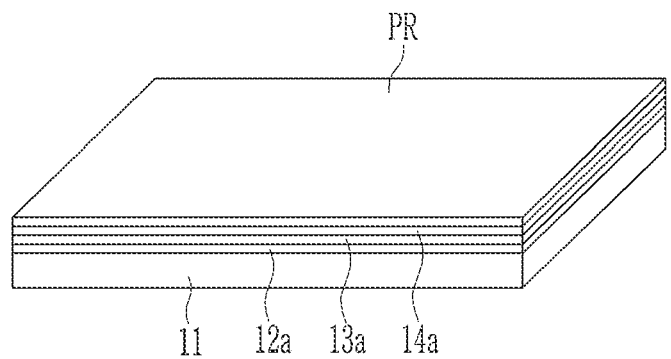
Figure 8B:
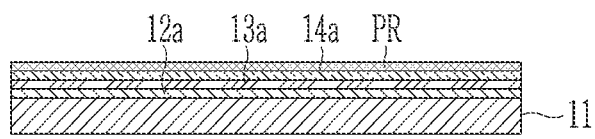

Next, as shown in FIG. 8A and FIG. 8B, a photoresist layer PR is formed on the surface (e.g., the entire surface) of the transparent substrate 11 on the second insulating material layer 14a.

Figure 9A:
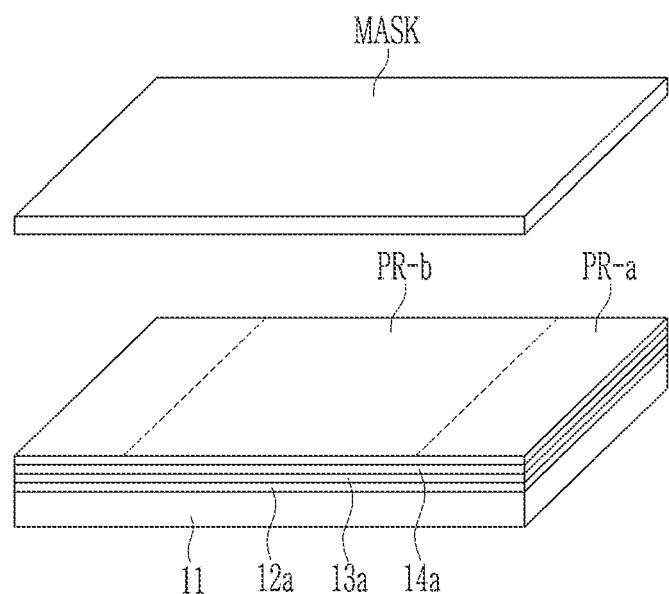
Figure 9B:
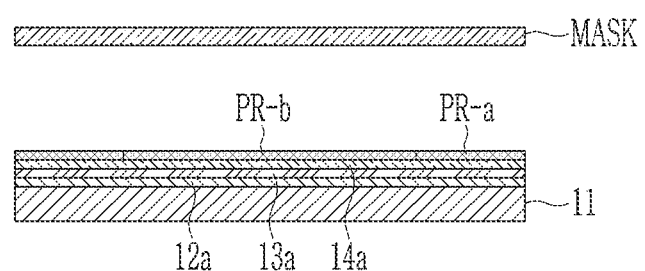
Figure 10A:
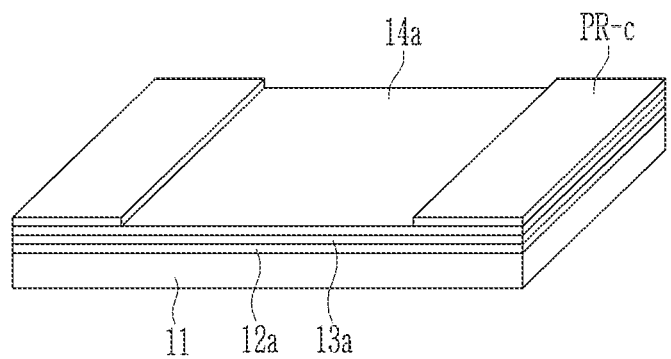
Figure 10B:
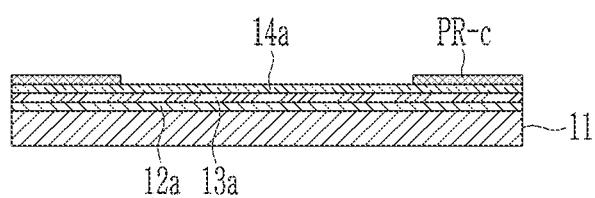

Next, as shown in FIG. 9A and FIG. 9B, a first region PR-a (e.g., a first region of the photoresist layer PR) that is cured by light (e.g., irradiated by light to be cured) and a second region PR-b (e.g., a second region of the photoresist layer PR) that is not cured may be formed utilizing (e.g., using) a mask MASK. For example, in some embodiments, when light is irradiated onto the first region PR-a to cure the first region PR-a, the mask MASK overlaps the second region PR-b in a plan view to block light from being irradiated onto the second region PR-b. Subsequently, the second region PR-b is removed through a developing process, and as shown FIG. 10A and FIG. 10B, a photoresist pattern PR-c is formed. The photoresist pattern PR-c may expose a part of the second insulating material layer 14a.

Figure 11A:
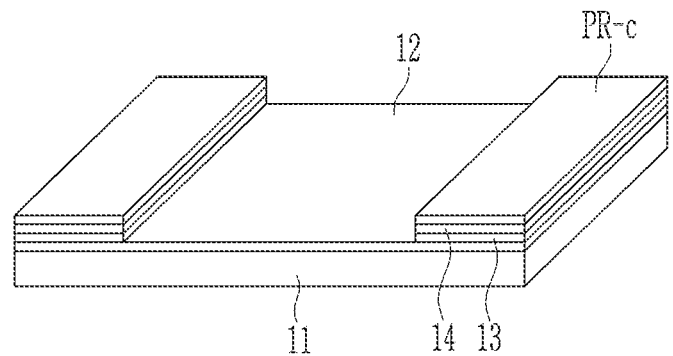
Figure 11B:
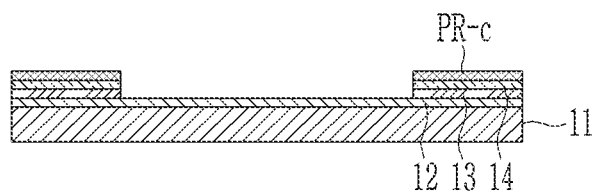
Figure 12A:
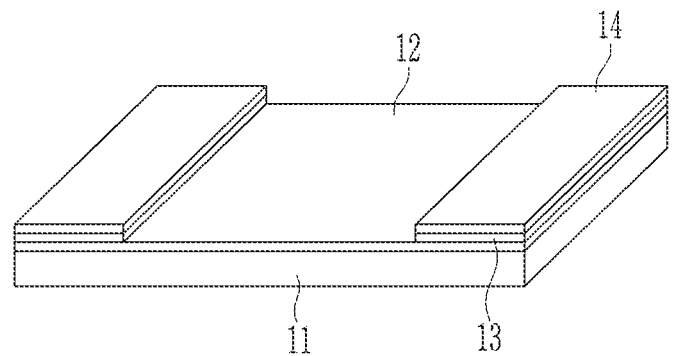
Figure 12B:
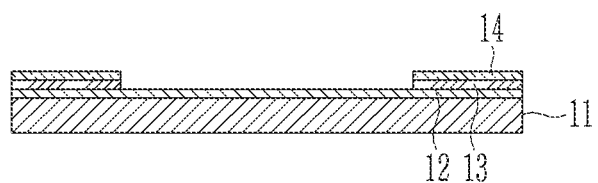

Next, as shown in FIG. 11A and FIG. 11B, the second insulating layer 14 and the first metal layer 13 are formed by utilizing (e.g., using) the photoresist pattern PR-c as a mask. The second insulating layer 14 may be formed by etching the second insulating material layer 14a, and the first metal layer 13 may be formed by etching the first metal material layer 13a. The first insulating layer 12 may be formed to overlap the surface (e.g., the entire surface) of the transparent substrate 11 without a separate etching. Next, as shown in FIG. 12A and FIG. 12B, the photoresist pattern PR-c is removed.

Figure 13A:
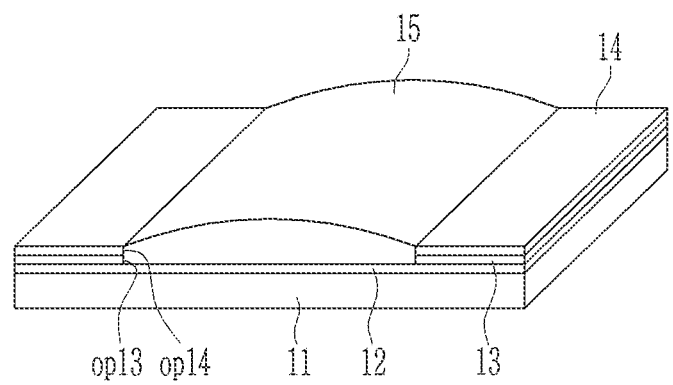
Figure 13B:
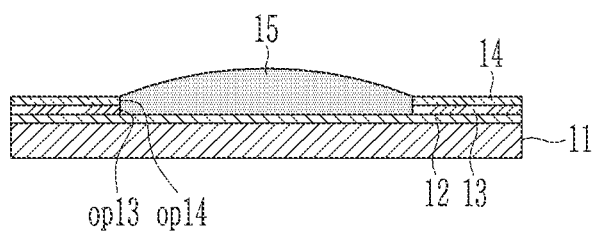

Then, as shown in FIG. 13A and FIG. 13B, a lens unit 15 may be formed in the first opening op13 in the first metal layer 13 and the second opening op14 in the second insulating layer 14. The lens unit 15 may be manufactured by utilizing (e.g., using) an inkjet process and/or a screen printing process as an example.

Since the second insulating layer 14 has hydrophobicity, the lens unit 15 may be easily disposed within the first and second openings op13 and op14. Next, the pellicle layer may be added to provide the photomask assembly as shown in FIG. 1.

By utilizing (e.g., using) a similar method, a plurality of sub-lens units 15a may be formed in the first opening op13 in the first metal layer 13 and the second opening op14 in the second insulating layer 14, and the photomask assembly as shown in FIG. 2 may thereby be provided.

A plurality of sub-lens units 15a may be formed by performing a plurality of processes of injecting and curing the first polymer. Also, the polymer layer 15b disposed on a plurality of sub-lens units 15a may be further formed, and the photomask assembly as shown in FIG. 3 may thereby be provided.

The photomask assembly according to an embodiment may easily adjust the width of the signal wire formed on the substrate, and accordingly, it is possible to easily implement fine wiring and fine patterns.

While this present disclosure has been described in connection with some embodiments, it is to be understood that the present disclosure is not limited to the disclosed embodiments. On the contrary, it is intended to cover various suitable modifications and equivalent arrangements included within the spirit and scope of the appended claims and equivalents thereof.

| Description of symbols |
| --- |
| 11: transparent substrate |
| 12: first insulating layer |
| 13: first metal layer |
| 14: second insulating layer |
| 15: lens unit |
| 15a: sub-lens unit |
| 15b: polymer layer |

What is claimed is:

1. A photomask assembly comprising:
a transparent substrate;
a first insulating layer on the transparent substrate and having hydrophilicity;
a first metal layer directly disposed on the first insulating layer and having a first opening;
a second insulating layer directly disposed on the first metal layer, having hydrophobicity, and having a second opening; and
a lens unit in the first opening and the second opening,
wherein the photomask assembly is a lithography photomask assembly, and
wherein a side wall of the second insulating layer forming the second opening is aligned with a side wall of the first metal layer forming the first opening,
wherein the lens unit contacts with the side wall of the second insulating layer, the side wall of the first metal layer, and a surface of the first insulating layer,
wherein the first insulating layer is continuously disposed in the first opening, and
wherein the lens unit comprises a plurality of sub-lens units in the first opening.

2. The photomask assembly of claim 1, further comprising a pellicle overlapping the transparent substrate,
wherein the lens unit has a surface protruded toward the pellicle.

3. The photomask assembly of claim 1, further comprising a polymer layer covering the plurality of sub-lens units.

4. The photomask assembly of claim 3, wherein the plurality of sub-lens units are each different in refractive index than the polymer layer.

5. A photomask assembly comprising:
a transparent substrate;
a first insulating layer on the transparent substrate;
a first metal layer directly disposed on the first insulating layer and having a first opening;
a second insulating layer directly disposed on the first metal layer and having a second opening; and
a lens unit in the first opening and the second opening,
wherein the lens unit comprises at least two or more sub-lens units in the same first opening and in the same second opening,
wherein a side wall of the second insulating layer forming the second opening is aligned with a side wall of the first metal layer forming the first opening,
wherein the lens unit contacts with the side wall of the second insulating layer, the side wall of the first metal layer, and a surface of the first insulating layer, and
wherein the first insulating layer is continuously disposed in the first opening.

6. The photomask assembly of claim 5, further comprising a polymer layer covering the two or more sub-lens units.

7. The photomask assembly of claim 6, wherein the polymer layer overlaps the first opening and the second opening.

8. The photomask assembly of claim 5, wherein the first insulating layer has hydrophilicity.

9. The photomask assembly of claim 5, wherein the first metal layer comprises chromium and/or molybdenum.

10. The photomask assembly of claim 5, wherein the second insulating layer has hydrophobicity.

11. The photomask assembly of claim 6, wherein the two or more sub-lens units comprise a first polymer having hydrophilicity.

12. The photomask assembly of claim 11, wherein the first polymer comprises a polyester-based compound.

13. The photomask assembly of claim 7, wherein the polymer layer comprises a second polymer, and the polymer layer is different in refractive index than each of the two or more sub-lens units.

14. The photomask assembly of claim 5, further comprising a pellicle overlapping the transparent substrate.

15. A photomask assembly comprising:
a transparent substrate;
a first insulating layer on the transparent substrate;
a first metal layer directly disposed on the first insulating layer and having a first opening;
a second insulating layer directly disposed on the first metal layer and having a second opening;
a lens unit in the first opening and the second opening; and
a polymer layer in contact with, and covering, an upper side of the lens unit,
wherein the lens unit is different in refractive index than the polymer layer,
wherein the lens unit comprises at least two or more sub-lens units in the same first opening and in the same second opening,
wherein the photomask assembly is a lithography photomask assembly,
wherein the lens unit contacts with a side wall of the second insulating layer, a side wall of the first metal layer, and a surface of the first insulating layer, and
wherein the first insulating layer is continuously disposed in the first opening.

16. The photomask assembly of claim 15, wherein each of the lens unit and the polymer layer comprises a polyester-based compound.

17. The photomask assembly of claim 15, wherein the first insulating layer has hydrophilicity and the second insulating layer has hydrophobicity.

18. The photomask assembly of claim 15, wherein the first insulating layer comprises a silicon oxide, and the second insulating layer comprises a silicon nitride.

19. The photomask assembly of claim 15, wherein the first metal layer comprises chromium and/or molybdenum.

* * * * *